United States Patent
Li et al.

(10) Patent No.: US 6,331,479 B1
(45) Date of Patent: Dec. 18, 2001

(54) METHOD TO PREVENT DEGRADATION OF LOW DIELECTRIC CONSTANT MATERIAL IN COPPER DAMASCENE INTERCONNECTS

(75) Inventors: Jianxun Li; Mei Sheng Zhou; Yi Xu; Simon Chooi, all of Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/398,294

(22) Filed: Sep. 20, 1999

(51) Int. Cl.[7] .............................................. H01L 21/4763
(52) U.S. Cl. .................... 438/618; 438/622; 438/638; 438/687
(58) Field of Search .................................. 438/618, 622, 438/623, 638, 687

(56) References Cited

U.S. PATENT DOCUMENTS

| | | | |
|---|---|---|---|
| 5,708,303 | 1/1998 | Jeng | 257/758 |
| 5,741,626 | 4/1998 | Jain et al. | 430/314 |
| 5,741,741 | 4/1998 | Tseng | 438/637 |
| 5,882,996 | * | 3/1999 | Dai . |
| 6,040,243 | * | 3/2000 | Li et al. . |
| 6,100,184 | * | 8/2000 | Zhao et al. . |
| 6,162,728 | * | 12/2000 | Tsao et al. . |

\* cited by examiner

*Primary Examiner*—Kevin M. Picardat
*Assistant Examiner*—D. M. Collins
(74) *Attorney, Agent, or Firm*—George O. Saile; Rosemary L. S. Pik

(57) ABSTRACT

A method of fabricating trenches has been achieved. The method may be applied to damascene and dual damascene contacts to prevent damage to organic low dielectric constant materials due to photoresist ashing. A semiconductor substrate is provided. A first dielectric layer is deposited overlying the semiconductor substrate. A first etch stopping layer is deposited overlying the first dielectric layer. A second etch stopping layer is deposited overlying the first etch stopping layer. An optional anti-reflective coating is applied. A photoresist layer is deposited. The photoresist layer is patterned to define openings for planned trenches. The second etch stopping layer is etched through to form a hard mask for the planned trenches. The photoresist layer is stripped away by ashing where the first etch stopping layer protects the first dielectric layer from damage due to the presence of oxygen radicals. The first etch stopping layer is etched through to complete the trenches, and the integrated circuit device is completed.

23 Claims, 7 Drawing Sheets

METHOD TO PREVENT DEGRADATION OF LOW DIELECTRIC CONSTANT MATERIAL IN COPPER DAMASCENE INTERCONNECTS

BACKGROUND OF THE INVENTION (1) Field of the Invention

The invention relates to a method of fabricating silicon structures, and more particularly, to the prevention of the degradation of dielectric material, due to photoresist ashing, in the formation of copper damascene interconnects in the manufacture of integrated circuit devices.

(2) Description of the Prior Art

Copper damascene interconnects are becoming increasingly common in the art of integrated circuit manufacture. Copper interconnects offer a significant advantage over traditional aluminum interconnects because of the lower resistivity of copper. Unfortunately, copper does not etch as easily as aluminum. This fact makes it difficult to fabricate copper interconnects using the traditional deposition and patterning techniques.

Damascene techniques allow copper to be used as the interconnect material. In damascene processes, trenches are first patterned into a dielectric material. Then copper is deposited overlying the dielectric material to fill the trenches. Finally, a polish down operation is performed to remove excess copper and to form the interconnect patterns within the confines of the trenches.

Referring to FIG. 1, a cross-section of a partially completed, self-aligned, dual damascene structure in a prior art integrated circuit device is shown. An isolation layer 14 overlies a semiconductor substrate 10. A first copper interconnect 22, isolated by a first barrier layer 18, is formed through the isolation layer 14. A passivation layer 26 is formed overlying the isolation layer 14 and the first copper interconnects 22. A first dielectric layer 30 overlies the passivation layer 26. An etch stopping layer 34 overlies the first dielectric layer 30. A photoresist layer 38 overlies the etch stopping layer 34. The photoresist layer 38 is patterned to form openings where vias are planned for the self-aligned, dual damascene interconnects.

Referring now to FIG. 2, the etch stopping layer 34 is etched through to expose the underlying first dielectric layer 30. To completely etch the etch stopping layer 34, some over-etching into the first dielectric layer 30 must occur.

Referring now to FIG. 3, the photoresist layer 38 is stripped away. The conventional processes used for stripping photoresist are photoresist ashing or reactive ion etching (RIE) ashing. In ashing processes, a plasma of oxygen radicals are generated to etch away the developed photoresist, either isotropically or anisotropically. Unfortunately, the oxygen radicals will also attack 46 the exposed first dielectric layer 30. If an organic low dielectric constant material is used for the first dielectric layer 30, the degradation 46 caused by the ashing process is particularly severe. In addition, a post-etch solvent cleaning is often performed. This cleaning operation can attack the exposed interface between the first dielectric layer 30 and etch stopping layer 34.

Referring now to FIG. 4, a second dielectric layer 50 is deposited overlying the etch stopping layer 34 and the first dielectric layer 30. Due to the previously discussed degradation of the first dielectric layer 30 in the opening of the etch stopping layer 34, the second dielectric layer 50 fails to planarize. A cap layer 54 is deposited overlying the second dielectric layer 50. The lack of planarization is shown 58. In addition, the reaction of oxygen radicals in the ashing plasma with the dielectric layers can cause bowing of the trench sidewalls and via poisoning. Via poisoning results from oxidation of the sidewalls of the trenches etched in the organic low dielectric constant material. Moisture can then be trapped in the oxidized surface. During subsequent high temperature processing, such as barrier metal deposition, the trapped moisture outgasses and prevents proper adhesion of the barrier layer.

Several prior art approaches disclose methods to form dual damascene structures in the fabrication of integrated circuits. U.S. Pat. No. 5,882,996 to Dai discloses a process to etch dual damascene trenches where a stack of photoresist, anti-reflective coating, and photoresist is used to pattern the trenches. U.S. Pat. No. 5,708,303 to Jeng teaches a process to form damascene interconnects where a low dielectric constant material is formed between metal interconnects with high dielectric constant layers, both overlying and underlying the interconnects, to reduce cross-talk. U.S. Pat. No. 5,741,741 to Tseng discloses a process to make planar metal interconnects using dual damascene structures. A hard mask layer overlying a planar insulating layer is used with two photoresist layers to create the dual damascene trenches. U.S. Pat. No. 5,741,626 to Jain et al teaches a method to form damascene structures using tantalum nitride ($Ta_3N_5$) as an anti-reflective coating, etching stop, or diffusion barrier.

SUMMARY OF THE INVENTION

A principal object of the present invention is to provide an effective and very manufacturable method of forming dual damascene copper interconnects in the manufacture of integrated circuits.

A further object of the present invention is to provide a method to fabricate damascene copper interconnects where degradation of the dielectric material due to photoresist ashing is eliminated.

A yet further object of the present invention is to prevent degradation of the dielectric material due to photoresist ashing by using two, dissimilar, etch stopping layers underlying the photoresist layer and overlying the dielectric material.

Another yet further object of the present invention is to prevent poor planarization of dielectric layers, trench bowing, and via poisoning due to photoresist ashing damage.

In accordance with the objects of this invention, a new method of fabricating dual damascene interconnects has been achieved. First copper interconnects are provided through an isolation layer overlying a semiconductor substrate. A passivation layer is deposited overlying the first copper interconnects and the isolation layer. A first dielectric layer is deposited overlying the passivation layer. A first etch stopping layer is deposited overlying the first dielectric layer. A second etch stopping layer is deposited overlying the first etch stopping layer. The first etch stopping layer comprises a material that has a lower etch rate than the second etch stopping layer in a process used to etch the second etch stopping layer. A photoresist layer is deposited overlying the second etch stopping layer. The photoresist layer is patterned to define openings for planned via trenches. The second etch stopping layer is etched through to form a hard mask for the planned via trenches. The photoresist layer is stripped away by ashing where the first etch stopping layer protects the first dielectric layer from damage due to the presence of oxygen radicals. A second dielectric layer is deposited overlying the second etch stopping layer and the first etch stopping layer. A first cap layer is deposited overlying the second dielectric layer. A second cap layer is deposited overlying the first cap layer. The second cap layer comprises a material that has a lower etch rate than the first cap layer in a process used to etch the first cap layer. An optional anti-reflective coating layer is deposited overlying the second cap layer. A photoresist layer is deposited overlying the anti-reflective coating layer. The photoresist layer is patterned to define openings for planned interconnect trenches. The second cap layer is etched through to form a hard mask for the planned interconnect trenches. The photoresist layer and the anti-reflective coating are stripped away by photoresist ashing where the first cap layer protects the second dielectric layer from damage due to the presence of oxygen radicals in the ashing step. The first cap layer, the second dielectric layer, the first etch stopping layer, and the first dielectric layer are etched through to complete the interconnect trenches and the via trenches. The second cap layer is etched away. The passivation layer is etched through to expose the top surface of the first copper interconnects. A barrier layer is deposited overlying the cap layer and the interior of the interconnect trenches and via trenches. A copper layer is deposited overlying the barrier layer and filling the interconnect trenches and the via trenches. The copper layer and barrier layer are polished down to the top surface of the cap layer to define interconnects, and the integrated circuit device is completed.

BRIEF DESCRIPTION OF THE DRAWINGS

In the accompanying drawings forming a material part of this description, there is shown.

DESCRIPTION OF THE PREFERRED EMBODIMENTS

Figure 1:
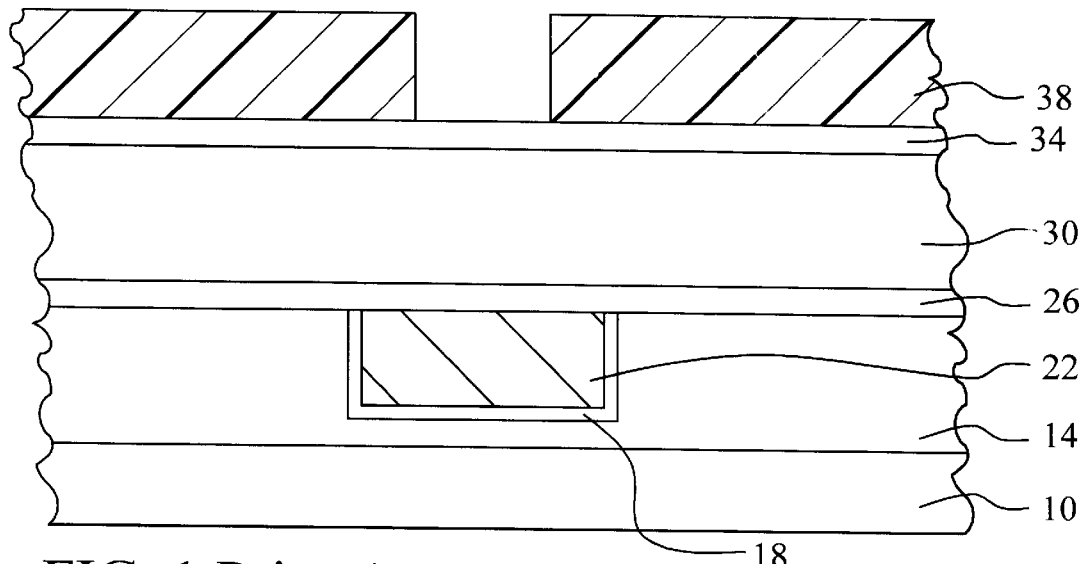
FIGS. 1 through 4 schematically illustrate in cross-section a partially completed prior art dual damascene interconnect in an integrated circuit device.
Figure 2:
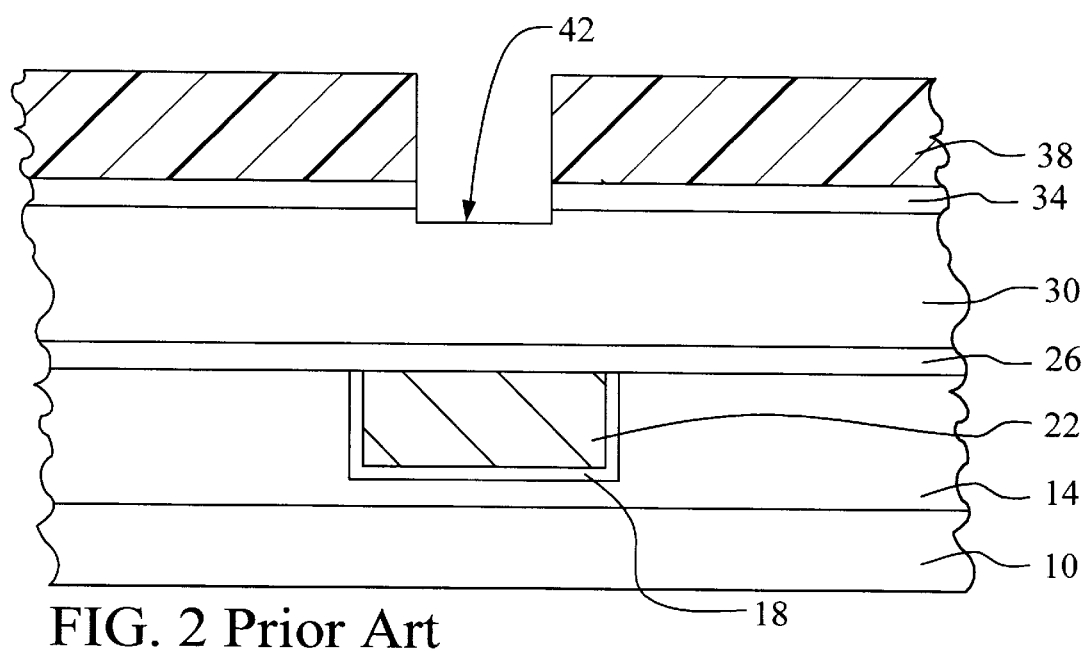
Figure 3:
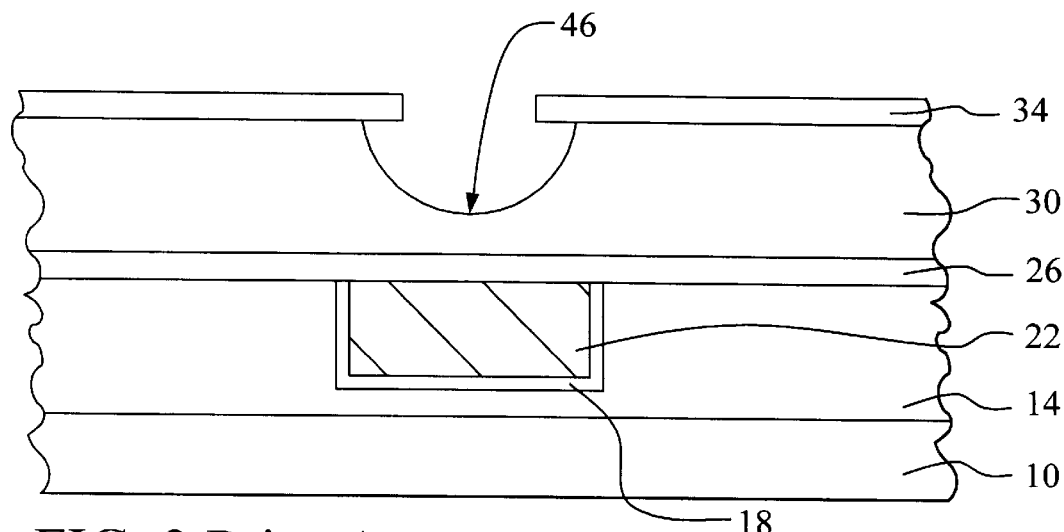
Figure 4:
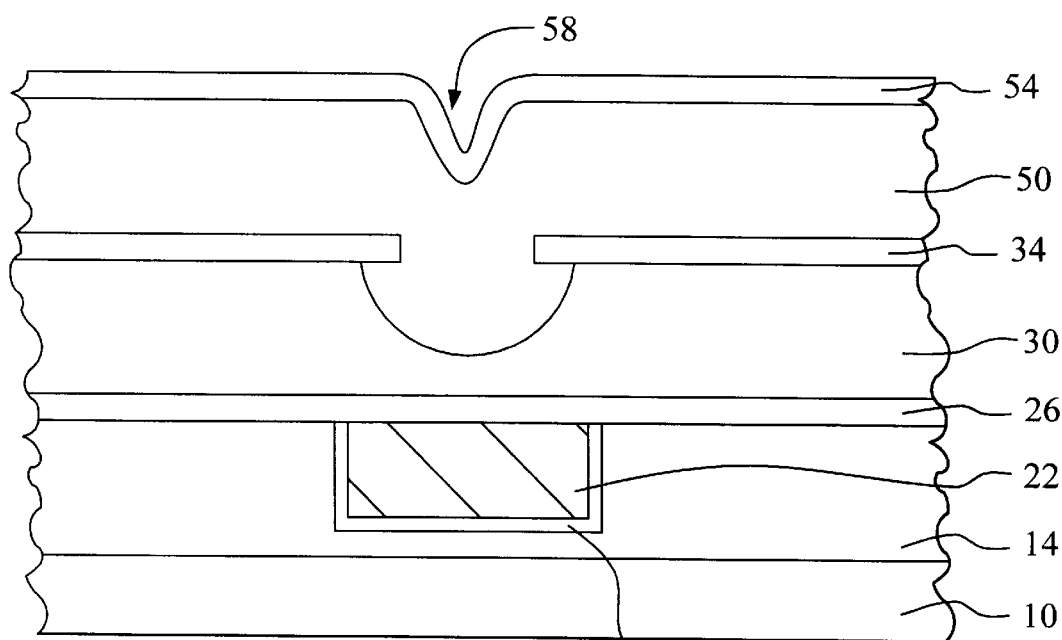
Figure 5:
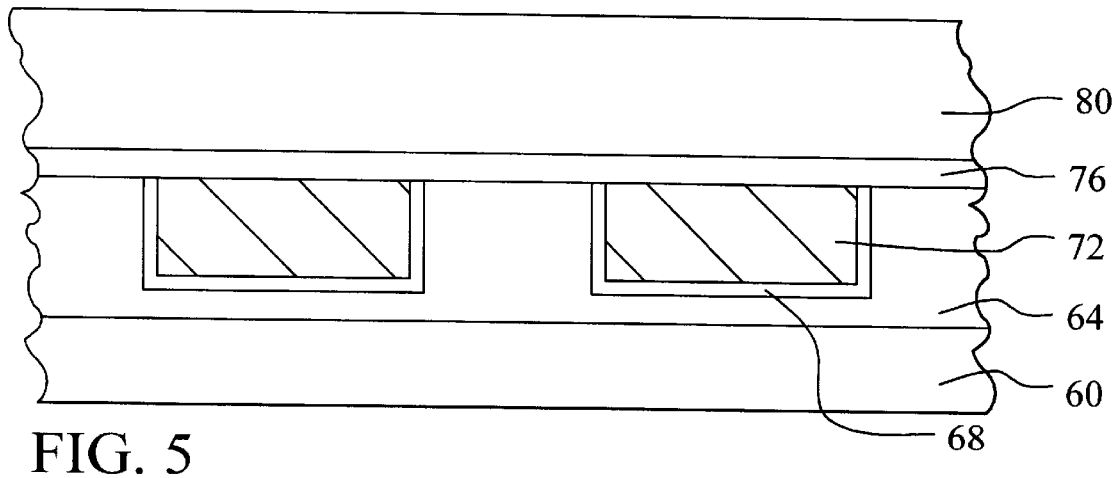
FIGS. 5 through 14 schematically illustrate in cross-sectional representation a preferred embodiment of the present invention.

Referring now more particularly to FIG. 5, there is illustrated, in a cross section, a partially completed integrated circuit device. This embodiment discloses the application of the present invention to the formation of dual damascene interconnects. The present invention can easily be applied to the formation of single damascene interconnects as well. It should be clear to those experienced in the art that the present invention can be applied and extended without deviating from the scope of the present invention.

A semiconductor substrate 60 is preferably composed of monocrystalline silicon. First copper interconnects 72 are conventionally provided through an isolation layer 64 overlying the semiconductor substrate 60. Typically in the art, a barrier metal layer 68 is formed between the first copper interconnects 72 and the isolation layer 64. The top surfaces of the first copper interconnects 72 and the isolation layer 64 are coplanar and exposed.

A passivation layer 76 is deposited overlying the first copper interconnects 72 and the isolation layer 64. The passivation layer 76 serves as an etching stop for the via trench etch. In addition, the passivation layer 76 prevents out-diffusion of the copper material in the first copper interconnects 72. The passivation layer 72 preferably comprises silicon nitride deposited to a thickness of between about 100 Angstroms and 5,000 Angstroms.

A first dielectric layer 80 is deposited overlying the passivation layer 76. The first dielectric layer 80 is preferably comprised of an organic low dielectric constant material such as: amorphous fluorocarbon, FLARE (manufactured by Allied Signal), SiLK (manufactured by Dow Chemical), methyl silsesquioxane (Black Diamond (manufactured by Applied Materials) and Coral (manufactured by Novellus). The first dielectric layer 80 is preferably deposited to a thickness of between about 1,000 Angstroms and 10,000 Angstroms.

Figure 6:
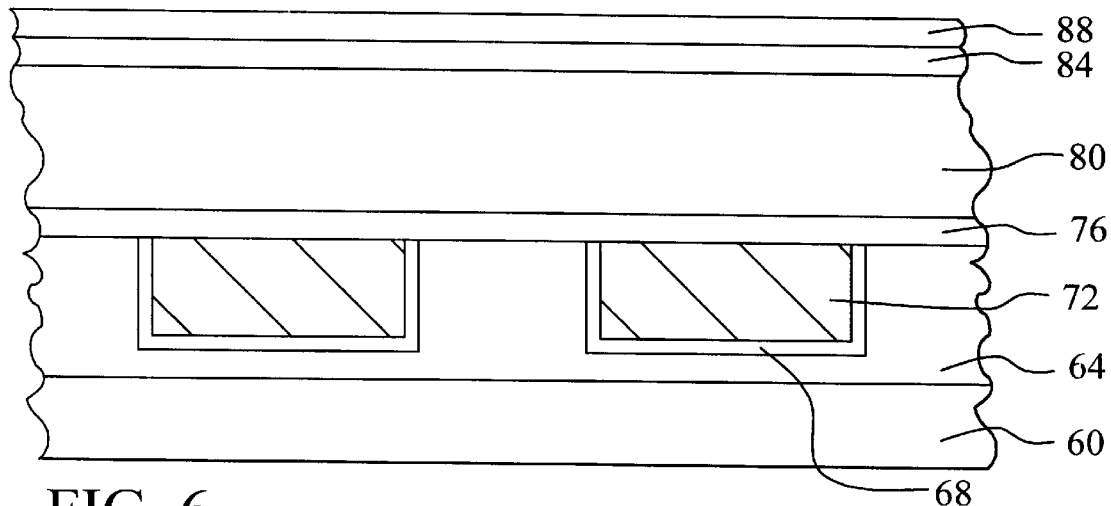

Referring now to FIG. 6, an important feature of the present invention is described. A first etch stopping layer 84 is deposited overlying the first dielectric layer 80. A second etch stopping layer 88 is then deposited overlying the first etch stopping layer 84. The key feature of the present invention is that the first etch stopping layer 84 and the second etch stopping layer 88 are comprised of different materials such that the first etch stopping layer 84 has a lower etch rate than the second etch stopping layer 88 in a process used to etch the second etch stopping layer 88.

The first etch stopping layer 84 and the second etch stopping layer 88 may be comprised of any one of the following materials: undoped silicon dioxide, doped silicon dioxide (borosilicate glass, phosphosilicate glass, borophosphosilicate glass, sub-atmospheric borophosphosilicate glass (SABPSG), and fluorinated silicate glass), silicon nitride, silicon oxynitride, boron nitride, inorganic low dielectric constant hydrogen silsesquioxane, silicon carbide, and BLOK (manufactured by Applied Materials). Once the first etch stopping layer 84 material is selected, the second etch stopping layer 88 must be selected such that the etch rate of the first etch stopping layer 84 is much less than that of the second etch stopping layer 88 for a conventional etching process.

In the preferred embodiment of the present invention, silicon nitride is chosen for the first etch stopping layer 84. The second etch stopping layer 88 must therefore be something other than silicon nitride. If silicon nitride is chosen for the first etch stopping layer 84, then the second etch stopping layer 88 is one of the group of: undoped silicon dioxide, doped silicon dioxide (borosilicate glass, phosphosilicate glass, borophosphosilicate glass, sub-atmospheric borophosphosilicate glass (SABPSG), and fluorinated silicate glass), silicon oxynitride, boron nitride, inorganic low dielectric constant hydrogen silsesquioxane, silicon carbide, and BLOK (manufactured by Applied Materials). The first etch stopping layer 84 is typically deposited to a thickness of between about 50 Angstroms and 5,000 Angstroms. The second etch stopping layer 88 is typically deposited to a thickness of between about 100 Angstroms and 5,000 Angstroms.

Figure 7:
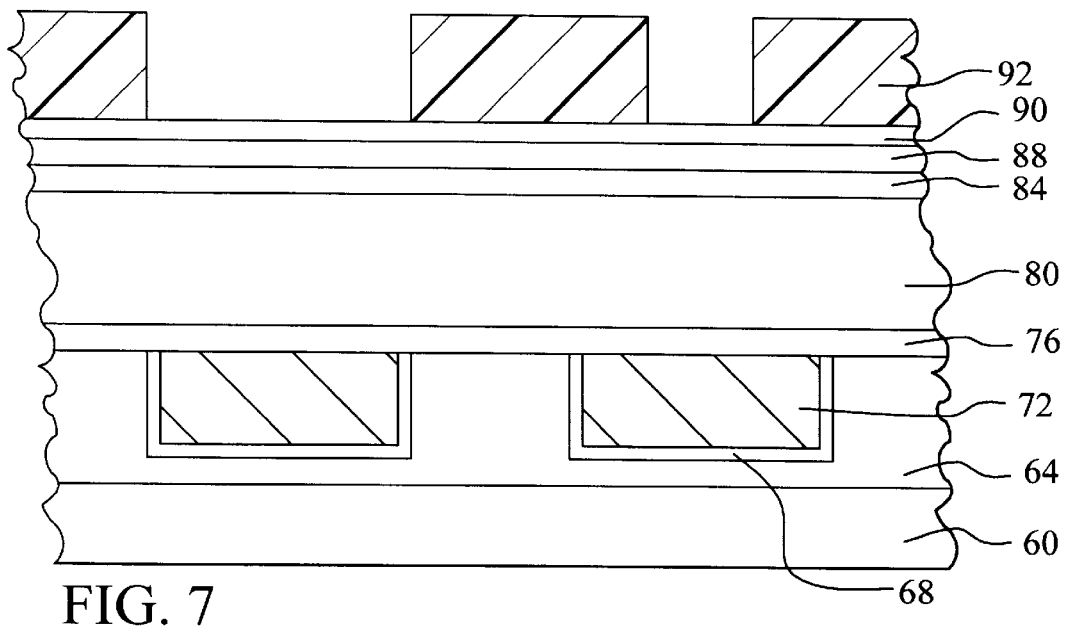

Referring now to FIG. 7, an optional anti-reflective coating layer 90 is deposited overlying the second etch stopping layer 88. The anti-reflective coating (ARC) layer 90 improves the photolithographic process for deep ultraviolet (DUV) lithography and must be applied prior to the photoresist. A suitable material for the anti-reflective coating layer 90 is a polyacrylate-based material such as AR2 (manufactured by Shipley). The thickness of the anti-reflective coating layer 90 is between about 100 Angstroms and 2,500 Angstroms. A photoresist layer 92 is deposited overlying the anti-reflective coating layer 90. If the anti-reflective coating layer 90 was not used, then the photoresist layer 92 would be deposited directly onto the second etch stopping layer 88. The photoresist layer 92 is applied and then patterned using a photolithographic exposure and development sequence. The patterning of the photoresist layer 92 defines openings for planned via trenches.

Figure 8:
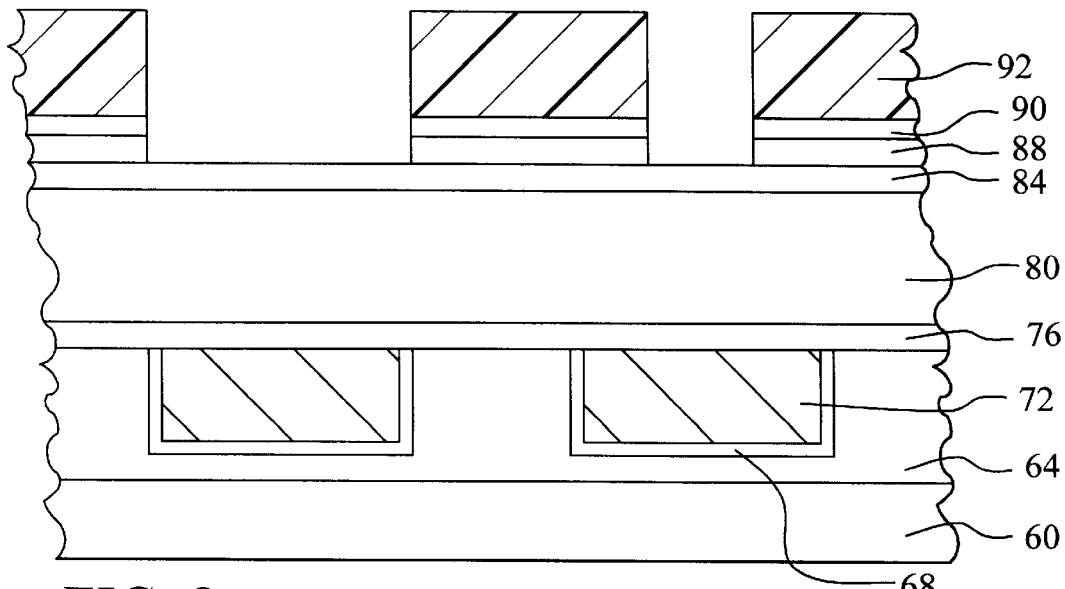

Referring now to FIG. 8, the second etch stopping layer 88 is etched through to expose the top surface of the first etch stopping layer 84. A hard mask is thus formed for the planned via trenches. The etching step is performed using a conventional reactive ion etching (RIE) chemistry. This RIE chemistry must be selected such that the etching rate for the second etch stopping layer 88 is much greater than the rate for the first etch stopping layer 84.

Figure 9:
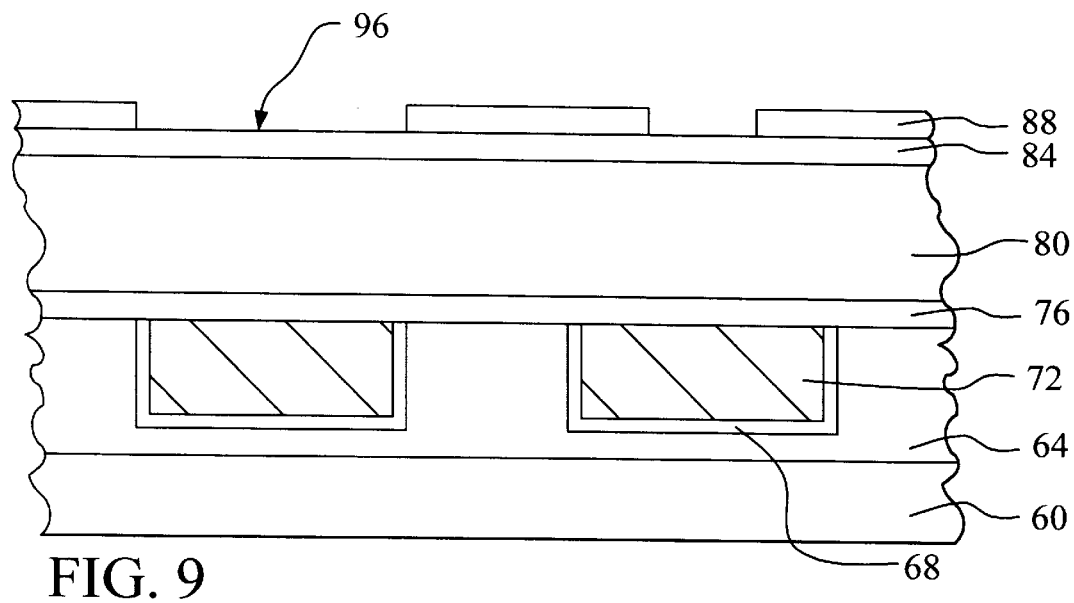

Referring now to FIG. 9, the photoresist layer 92 is stripped away by ashing. Here, the presence of the first etch stopping layer 84 protects the first dielectric layer 80 from damage due to oxygen radicals 96 in the ashing plasma. The types of damage described in the prior art, including trench bowing and via poisoning, are therefore eliminated. The ashing step may be performed using conventional photoresist ashing or RIE ashing.

Figure 10:
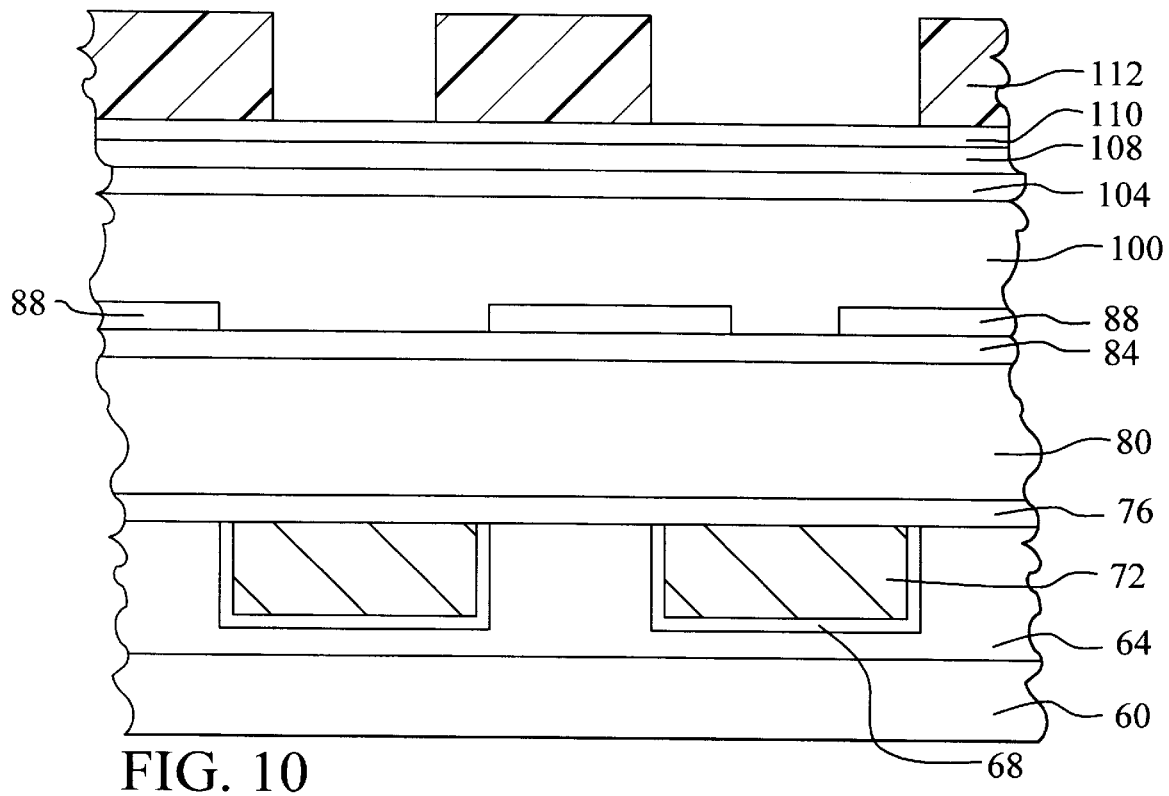

Referring now to FIG. 10, a second dielectric layer 100 is deposited overlying the second etch stopping layer 88 and the first etch stopping layer 84. The second dielectric layer 100 is preferably comprised of an organic low dielectric constant material such as: amorphous fluorocarbon, FLARE (manufactured by Allied Signal), SiLK (manufactured by Dow Chemical), methyl silsesquioxane (Black Diamond (manufactured by Applied Materials) and Coral (manufactured by Novellus). The second dielectric layer 100 is preferably deposited to a thickness of between about 1,000 Angstroms and 10,000 Angstroms.

A first cap layer 104 is deposited overlying the second dielectric layer 100. The first cap layer 104 is composed of either silicon dioxide, silicon carbide, silicon nitride, silicon oxynitride, or boron nitride. The first cap layer 104 serves as an etch stop for the second cap layer, as a polishing stop for the copper polish down, and as a hard mask for the low dielectric constant material etch. The first cap layer 104 is preferably deposited to a thickness of between about 50 Angstroms and 5,000 Angstroms.

A second cap layer 108 is deposited overlying the first cap layer 104. The second cap layer 108 is preferably comprised of silicon dioxide, silicon nitride, TiN, TaN, silicon oxynitride, silicon carbide, or boron nitride. The second cap layer 108 is preferably deposited to a thickness of between about 100 Angstroms and 7,500 Angstroms. An optional organic anti-reflective coating layer 110 can be deposited overlying the second cap layer 108 prior to the deposition of the photoresist layer 112. The anti-reflective coating layer 110 improves the photolithographic process for deep ultraviolet (DUV) lithography. The anti-reflective coating layer 110 is preferably comprised of polyacrylate-based material such as AR2(manufactured by Shipley). The anti-reflective coating layer 110 is deposited to a thickness of between about 100 Angstroms and 2,500 Angstroms.

A photoresist layer 112 is deposited overlying the anti-reflective coating layer 110. The photoresist layer 112 is applied and then patterned using a photolithographic exposure and development sequence. The patterning of the photoresist layer 112 defines openings for planned interconnect trenches.

Figure 11:
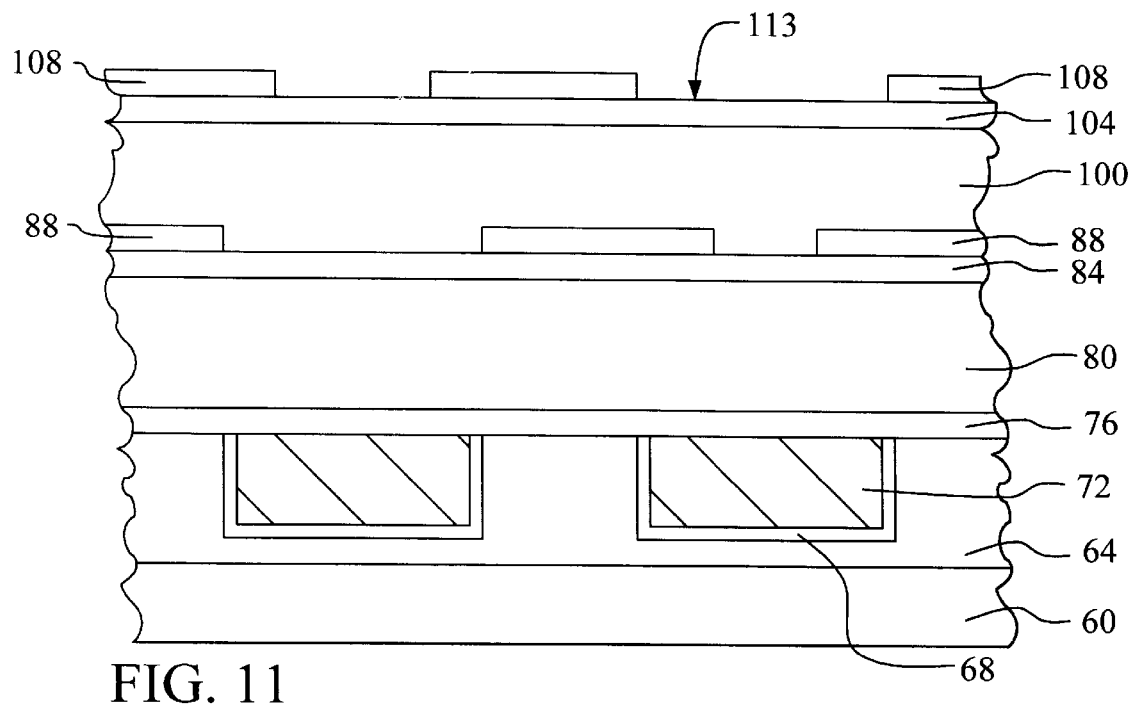

Referring now to FIG. 11, the second cap layer 108 is etched through to expose the top surface of the first cap layer 104 to form a hard mask for the planned interconnect trenches. The etching step is performed using a conventional reactive ion etching (RIE) chemistry. The RIE chemistry must be selected such that the etching rate for the second cap layer 108 is much greater than the rate for the first cap layer 104. Alternatively, a timed etch can be used if the first cap layer 104 and the second cap layer 108 are comprised of the same material. The photoresist layer 112 and the optional organic anti-reflective coating layer 110 are stripped away by ashing. Here, the presence of the first cap layer 104 protects the second dielectric layer 100 from damage 113 due to oxygen radicals in the ashing plasma. The ashing step may be performed using conventional photoresist ashing or RIE ashing.

Alternatively, it is also possible to process this step without using a second cap layer. In this case, the organic anti-reflective coating layer 110 would be applied directly overlying the first cap layer 104. The photoresist layer 112 would then be deposited overlying the organic anti-reflective coating layer 110. The photoresist layer 112 is then patterned using a photolithographic exposure and development sequence. The patterning of the photoresist layer 112 defines openings for planned interconnect trenches.

Figure 12:
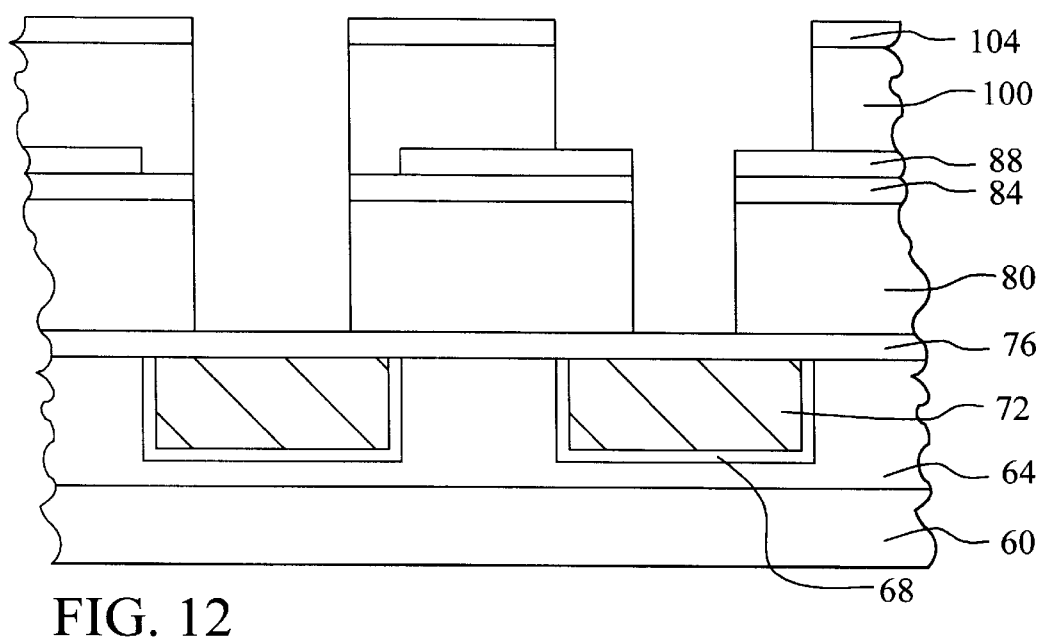

The first cap layer 104, second dielectric layer 100, the first etching stop layer 84 and the first dielectric layer 80 are etched. Any remaining photoresist layer 112 and the optional anti-reflective coating layer 110 are removed by oxygen ashing. The resulting cross section of this optional process is shown in FIG. 12.

Figure 13:
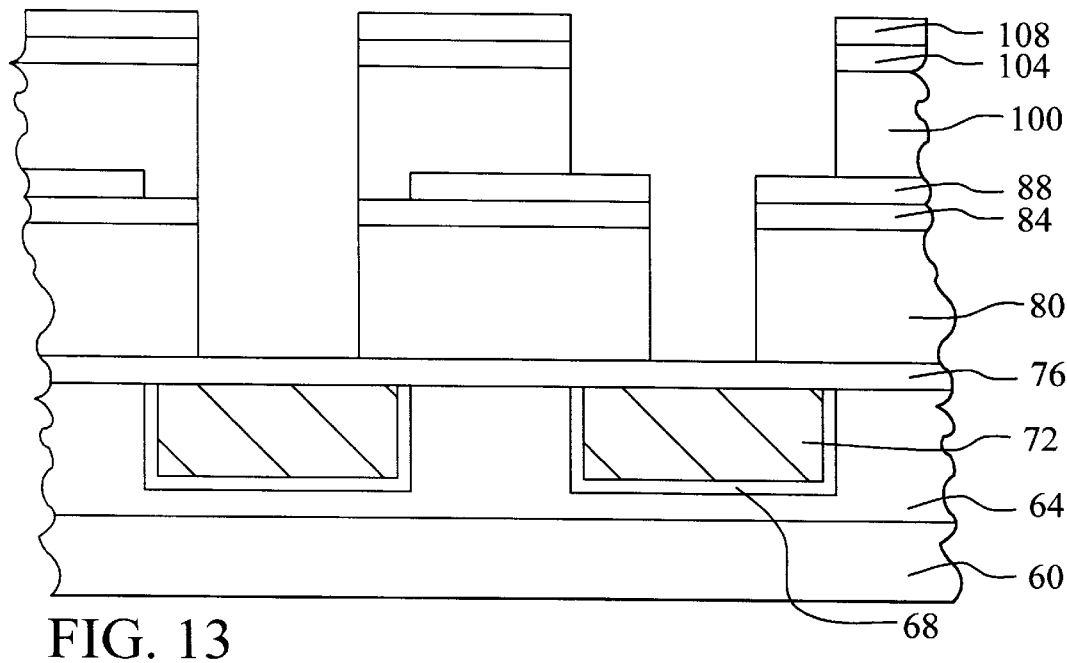

Referring now to FIG. 13 the next step in the typical process, utilizing the second cap layer 108, is shown. The first cap layer 104, the second dielectric layer 100, the first etch stopping layer 84, and the first dielectric layer 80 are etched through to complete the interconnect trenches and the via trenches. The etch is performed using a conventional reactive ion etch (RIE). The second cap layer 108 may be etched away during the etching of the first cap layer 104, the second dielectric layer 100, the first etch stopping layer 84 and the first dielectric layer 80.

Figure 14:
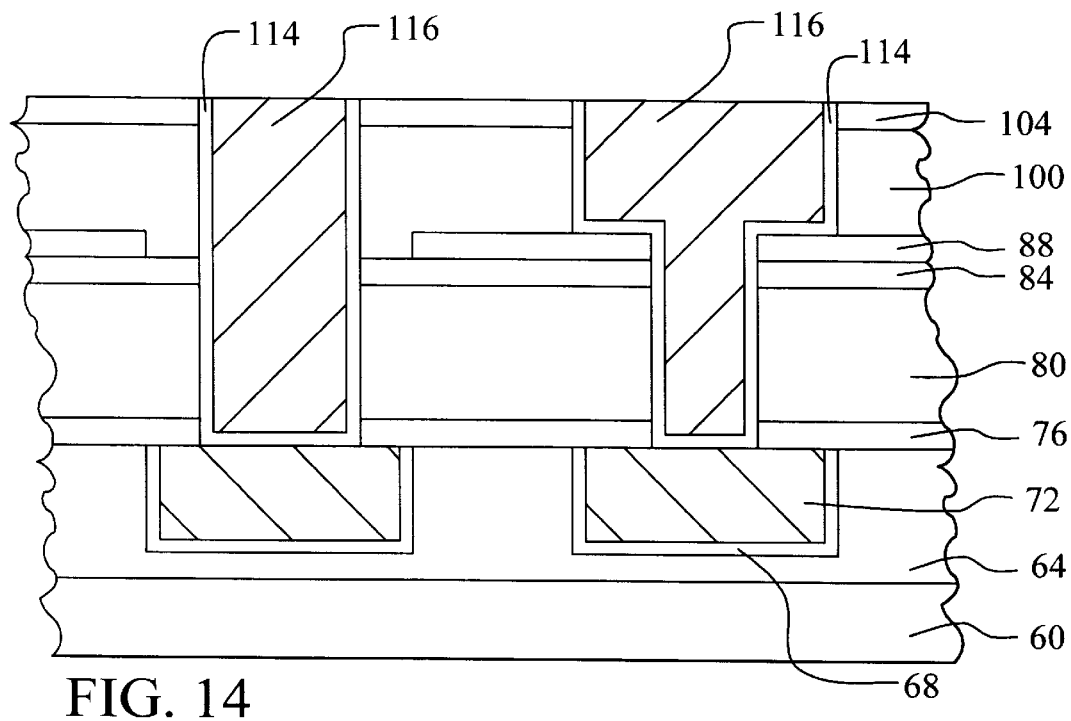

Referring now to FIG. 14, the passivation layer 76 is etched through to expose the top surface of the first copper interconnects 72. A wet cleaning step is implemented before a barrier layer 114 is deposited overlying the cap layer 104 and the interior of the interconnect trenches and via trenches. The purpose of the barrier layer 114 is to prevent out diffusion of copper from the interconnects. A copper layer 116 is deposited overlying the barrier layer 114 and filling the interconnect and via trenches. The copper layer 116 and the barrier layer 114 are then polished down by chemical mechanical polishing (CMP) to the top surface of the cap layer 104 to define interconnects. The integrated circuit can then be completed by conventional means.

As shown in the preferred embodiment, the present invention provides a very manufacturable process for fabricating damascene or dual damascene interconnects in the manufacture of integrated circuit devices. Damage to the dielectric layers, due to oxygen radicals in the ashing plasma, is prevented. The unique combination of dissimilar etch stopping layers allows the photoresist layer to be removed by conventional ashing without damaging the organic low dielectric constant materials.

While the invention has been particularly shown and described with reference to the preferred embodiments thereof, it will be understood by those skilled in the art that various changes in form and details may be made without departing from the spirit and scope of the invention.

What is claimed is:

1. A method to form trenches in the manufacture of an integrated circuit device comprising:

providing a semiconductor substrate;

depositing a first dielectric layer overlying said semiconductor substrate;

depositing a first etch stopping layer overlying said first dielectric layer;

depositing a second etch stopping layer overlying said first etch stopping layer wherein said first etch stopping layer has a lower etch rate than said second etch stopping layer;

depositing a photoresist layer overlying said second etch stopping layer;

patterning said photoresist layer to define openings for planned trenches;

etching through said second etch stopping layer to form a hard mask for said planned trenches;

stripping away said photoresist layer by ashing where said first etch stopping layer protects said first dielectric layer from damage due to the presence of oxygen radicals;

thereafter etching said first etch stopping layer to complete said trenches; and completing said integrated circuit device.

2. The method according to claim 1 wherein said first dielectric layer comprises an organic low dielectric constant material.

3. The method according to claim 1 wherein said first etch stopping layer comprises one of the group of: undoped silicon dioxide, doped silicon dioxide, silicon nitride, boron nitride, silicon carbide, inorganic low dielectric constant material, silicon oxynitride, and BLOK (manufactured by Applied Material).

4. The method according to claim 1 wherein said first etch stopping layer comprises silicon nitride.

5. The method according to claim 1 wherein said second etch stopping layer comprises one of the group of: undoped silicon dioxide, doped silicon dioxide, silicon nitride, boron nitride, inorganic low dielectric constant material, silicon oxynitride, silicon carbide and BLOK (manufactured by Applied Materials).

6. The method according to claim 1 wherein said first etch stopping layer is deposited to a thickness of between about 50 Angstroms and 5,000 Angstroms.

7. The method according to claim 1 wherein said second etch stopping layer is deposited to a thickness of between about 100 Angstroms and 5,000 Angstroms.

8. The method according to claim 1 further comprising:

depositing an anti-reflective coating layer overlying said second etch stopping layer before said step of depositing said photoresist layer;

etching through said anti-reflective coating layer after said step of patterning said photoresist layer and before said step of etching through said second etch stopping layer; and stripping away said anti-reflective coating layer by ashing during said step of stripping away said photoresist layer.

9. A method to form dual damascene trenches in the manufacture of an integrated circuit device comprising:

providing conductive traces in an isolation layer overlying a semiconductor substrate;

depositing a passivation layer overlying said conductive traces and said isolation layer;

depositing a first dielectric layer overlying said passivation layer;

depositing a first etch stopping layer overlying said first dielectric layer;

depositing a second etch stopping layer overlying said first etch stopping layer wherein said first etch stopping layer has a lower etch rate than said second etch stopping layer;

depositing a photoresist layer overlying said second etch stopping layer;

patterning said photoresist layer to define openings for planned via trenches;

etching through said second etch stopping layer to form a hard mask for said planned via trenches;

stripping away said photoresist layer by ashing where said first etch stopping layer protects said first dielectric layer from damage due to the presence of oxygen radicals;

thereafter depositing a second dielectric layer overlying said second etch stopping layer and said first etch stopping layer;

depositing a first cap layer overlying said second dielectric layer;

depositing a second cap layer overlying said first cap layer;

depositing a photoresist layer overlying said second cap layer;

patterning said photoresist layer to define openings for planned interconnect trenches;

etching through said second cap layer to form a hard mask for the planned interconnect trenches;

stripping away said photoresist layer by ashing where said first cap layer protects said second dielectric layer from damage due to the presence of oxygen radicals;

thereafter etching said first cap layer, said second dielectric layer, said first etch stopping layer, and said first dielectric layer to complete said interconnect trenches and said via trenches;

thereafter etching away said passivation layer to expose the top surface of said conductive traces; and completing said integrated circuit device.

10. The method according to claim 9 wherein said first dielectric layer comprises an organic low dielectric constant material.

11. The method according to claim 9 wherein said first etch stopping layer comprises one of the group of: undoped silicon dioxide, doped silicon dioxide, silicon nitride, boron nitride, inorganic low dielectric constant material, silicon oxynitride, silicon carbide, and BLOK (manufactured by Applied Materials).

12. The method according to claim 9 wherein said second etch stopping layer comprises one of the group of: undoped silicon dioxide, doped silicon dioxide, silicon nitride, boron nitride, inorganic low dielectrics constant materials, silicon oxynitride, silicon carbide and Applied Materials BLOK.

13. The method according to claim 9 wherein said first etch stopping layer is deposited to a thickness of between about 50 Angstroms and 5,000 Angstroms.

14. The method according to claim 9 wherein said second etch stopping layer is deposited to a thickness of between about 100 Angstroms and 5,000 Angstroms.

15. The method according to claim 9 wherein said first cap layer comprises one of the group of: silicon dioxide, silicon nitride, silicon oxynitride, and boron nitride.

16. The method according to claim 9 wherein said second cap layer is comprises one of the group of: silicon dioxide, silicon carbide, silicon nitride, silicon oxynitride, and boron nitride.

17. The method according to claim 9 further comprising:

depositing an anti-reflective coating layer overlying said second etch stopping layer before said step of depositing said photoresist layer;

etching through said anti-reflective coating layer after said step of patterning said photoresist and before said step of etching through said second etch stopping layer; and stripping away said anti-reflective coating layer during said step of stripping away said photoresist layer.

18. The method according to claim 9 further comprising:

depositing an anti-reflective coating layer overlying said second cap layer before said step of depositing said photoresist layer;

etching through said anti-reflective coating layer after said step of patterning said photoresist and before said step of etching through said second cap layer; and stripping away said anti-reflective coating layer during said step of stripping away said photoresist layer.

19. A method to form dual damascene trenches in the manufacture of an integrated circuit device comprising:

providing conductive traces in an isolation layer overlying a semiconductor substrate;

depositing a passivation layer overlying said conductive traces and said isolation layer;

depositing a first dielectric layer overlying said passivation layer;

depositing a first etch stopping layer overlying said first dielectric layer;

depositing a second etch stopping layer overlying said first etch stopping layer wherein said first etch stopping layer has a lower etch rate than said second etch stopping layer and wherein said second etch stopping layer comprises silicon nitride;

depositing an anti-reflective coating layer overlying said second etch stopping layer;

depositing a photoresist layer overlying said anti-reflective coating layer;

patterning said photoresist layer to define openings for planned via trenches;

etching through said anti-reflective coating layer and said second etch stopping layer to form a hard mask for said planned via trenches;

stripping away said photoresist layer and said anti-reflective coating layer by ashing where said first etch stopping layer protects said first dielectric layer from damage due to the presence of oxygen radicals;

thereafter depositing a second dielectric layer overlying said second etch stopping layer and said first etch stopping layer;

depositing a first cap layer overlying said second dielectric layer;

depositing a second cap layer overlying said first cap layer;

depositing an anti-reflective coating layer overlying said second cap layer;

depositing a photoresist layer overlying said anti-reflective coating layer;

patterning said photoresist layer to define openings for planned interconnect trenches;

etching through said anti-reflective coating layer and said second cap layer to form a hard mask for said planned interconnect trenches;

stripping away said photoresist layer and said anti-reflective coating layer by ashing where said first cap layer protects said second dielectric layer from damage due to the presence of oxygen radicals;

thereafter etching said first cap layer, said second dielectric layer, said first etch stopping layer, and said first dielectric layer to complete said interconnect trenches and said via trenches; and completing said integrated circuit device.

20. The method according to claim 19 wherein said first cap layer comprises one of the group of: silicon dioxide, silicon nitride, silicon carbide, silicon oxynitride, and boron nitride.

21. The method according to claim 19 wherein said second cap layer comprises one of the group of: silicon dioxide, silicon nitride, silicon carbide, silicon oxynitride, and boron nitride.

22. A method to form dual damascene trenches in the manufacture of an integrated circuit device comprising:

providing conductive traces in an isolation layer overlying a semiconductor substrate;

depositing a passivation layer overlying said conductive traces and said isolation layer;

depositing a first dielectric layer overlying said passivation layer;

depositing a first etch stopping layer overlying said first dielectric layer;

depositing a second etch stopping layer overlying said first etch stopping layer wherein said first etch stopping layer has a lower etch rate than said second etch stopping layer and wherein said second etch stopping layer comprises silicon nitride;

depositing an anti-reflective coating layer overlying said second etch stopping layer;

depositing a photoresist layer overlying said anti-reflective coating layer;

patterning said photoresist layer to define openings for planned via trenches;

etching through said anti-reflective coating layer and said second etch stopping layer to form a hard mask for said planned via trenches;

stripping away said photoresist layer and said anti-reflective coating layer by ashing where said first etch stopping layer protects said first dielectric layer from damage due to the presence of oxygen radicals;

thereafter depositing a second dielectric layer overlying said second etch stopping layer and said first etch stopping layer;

depositing a cap layer overlying said second dielectric layer;

depositing a photoresist layer overlying said cap layer;

patterning said photoresist layer to define openings for planned interconnect trenches;

etching through said cap layer, said second dielectric layer, said first etch stopping layer, and said first dielectric layer to form planned interconnect trenches and said via trenches;

stripping away said photoresist layer by ashing; and completing said integrated circuit device.

23. The method according to claim 22 further comprising:

depositing an anti-reflective coating layer overlying said cap layer before said step of depositing said photoresist layer;

etching through said anti-reflective coating layer after said step of patterning said photoresist and before said step of etching through said cap layer; and stripping away said anti-reflective coating layer during said step of stripping away said photoresist layer.

* * * * *

UNITED STATES PATENT AND TRADEMARK OFFICE
CERTIFICATE OF CORRECTION

PATENT NO. : 6,331,479 B1  
DATED : December 18, 2001  
INVENTOR(S) : Jianxun Li, Mei Sheng Zhou, Yi Xu and Simon Chooi Page 1 of 1

It is certified that error appears in the above-identified patent and that said Letters Patent is hereby corrected as shown below:

<u>Title page,</u>  
Item [74], please delete "Pik" and replace with -- Pike --.

Signed and Sealed this

Sixteenth Day of April, 2002

*Attest:*

JAMES E. ROGAN  
*Attesting Officer*     *Director of the United States Patent and Trademark Office*